United States Patent
Miyajima et al.

(10) Patent No.: US 7,360,346 B2
(45) Date of Patent: Apr. 22, 2008

(54) PURGING SYSTEM AND PURGING METHOD FOR THE INTERIOR OF A PORTABLE TYPE HERMETICALLY SEALED CONTAINER

(75) Inventors: Toshihiko Miyajima, Tokyo (JP); Takeshi Kagaya, Tokyo (JP); Hitoshi Suzuki, Tokyo (JP); Mutsuo Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 503 days.

(21) Appl. No.: 10/948,223

(22) Filed: Sep. 24, 2004

(65) Prior Publication Data

US 2005/0069420 A1 Mar. 31, 2005

(30) Foreign Application Priority Data

Sep. 25, 2003 (JP) .............................. 2003-332936

(51) Int. Cl.
 *B65B 31/02* (2006.01)
 *B65B 31/04* (2006.01)
(52) U.S. Cl. .............................. 53/432; 53/84; 53/510; 141/1; 141/91
(58) Field of Classification Search .................. 53/408, 53/403, 432, 79, 84, 510; 141/91, 93, 95
See application file for complete search history.

(56) References Cited

U.S. PATENT DOCUMENTS 3,672,207 A * 6/1972 Cramp et al. ................ 73/40.7
4,724,874 A 2/1988 Parikh et al.
5,169,272 A 12/1992 Bonora et al.
5,351,415 A * 10/1994 Brooks et al. ................. 34/389
5,370,491 A 12/1994 Bonora et al.
5,433,574 A * 7/1995 Kawano et al. .............. 414/217
5,476,008 A * 12/1995 Pinson ..................... 73/504.16
5,547,328 A 8/1996 Bonora et al.
5,586,585 A 12/1996 Bonora et al.
5,621,982 A * 4/1997 Yamashita et al. ............. 34/203
5,709,065 A * 1/1998 Krause ......................... 53/400

(Continued)

FOREIGN PATENT DOCUMENTS

JP 63-160228 7/1988

(Continued)

OTHER PUBLICATIONS

U.S. Appl. No. 10/849,024, filed May 20, 2004, Suzuki et al.

(Continued)

*Primary Examiner*—Rinaldi I. Rada
*Assistant Examiner*—Paul Durand
(74) *Attorney, Agent, or Firm*—Oblon, Spivak, McClelland, Maier & Neustadt, P.C.

(57) ABSTRACT

A fine pressure fluctuation at short time intervals occurring when a portable type hermetically sealed container is purged is reduced to thereby prevent the deterioration or the like of a seal member due to the pressure fluctuation. In order to achieve this object, a gas flow rate regulating apparatus is disposed in a gas supplying system in a purging system, and pressure in the portable type hermetically sealed container during purge is measured and the result thereof is fed back to thereby control the flow rate of a supplied gas.

4 Claims, 4 Drawing Sheets

U.S. PATENT DOCUMENTS

| | | | |
|---|---|---|---|
| 5,806,574 A * | 9/1998 | Yamashita et al. ............ 141/63 |
| 5,810,062 A | 9/1998 | Bonora et al. |
| 5,988,233 A | 11/1999 | Fosnight et al. |
| 6,056,026 A | 5/2000 | Fosnight et al. |
| 6,082,949 A | 7/2000 | Rosenquist |
| 6,135,168 A * | 10/2000 | Yang et al. .................... 141/98 |
| 6,164,664 A | 12/2000 | Fosnight et al. |
| 6,261,044 B1 * | 7/2001 | Fosnight et al. ............ 414/217 |
| 6,305,148 B1 * | 10/2001 | Bowden et al. ............... 53/432 |
| 6,319,297 B1 | 11/2001 | Fosnight |
| 6,796,763 B2 * | 9/2004 | Miyajima et al. ........... 414/805 |

FOREIGN PATENT DOCUMENTS

| | | |
|---|---|---|
| JP | 63-147813 | 9/1988 |
| JP | 3-180600 | 8/1991 |
| JP | 3-191392 | 8/1991 |
| JP | 3-240698 | 10/1991 |
| JP | 3-252457 | 11/1991 |
| JP | 3-277550 | 12/1991 |
| JP | 7-045488 A | 2/1995 |
| JP | 7-86370 | 3/1995 |
| JP | 11-251422 A | 9/1999 |
| JP | 11-307623 A | 11/1999 |
| JP | 3331693 | 7/2002 |
| JP | 3355697 | 10/2002 |
| JP | 2003-045933 A | 2/2003 |

OTHER PUBLICATIONS

U.S. Appl. No. 10/948,223, filed Sep. 24, 2004, Miyajima et al.

* cited by examiner

PURGING SYSTEM AND PURGING METHOD FOR THE INTERIOR OF A PORTABLE TYPE HERMETICALLY SEALED CONTAINER

BACKGROUND OF THE INVENTION

1. Field of the Invention

This invention relates to a purging system and a purging method for use when purging the interior of a space in a portable type hermetically sealed container, and more particularly to a portable type hermetically sealed container such as an SMIF pod which is a portable type hermetically sealed container for use when conveying a reticle or the like, for example, in the manufacturing process of a semiconductor or the like, and to a purging system for and a purging method of carrying out the process of purging the interior of a container such as the SMIF pod.

2. Related Background Art

Silicon wafers, glass substrates for liquid crystal display, substrates for hard disks, reticles, etc. are usually kept in a portable type hermetically sealed container, and are transported between processing apparatuses in manufacturing processes conforming to respective purposes while being kept in the hermetically sealed container. It is known that when these substrates, etc. are held in the atmosphere, natural oxidated film is formed on the surfaces thereof or the adherence of organic substances to the surfaces thereof occurs. This phenomenon often poses a problem in subjecting the substrates, etc. to some processing and therefore, the interior of the aforementioned hermetically sealed container is usually filled with an inert gas such as nitrogen of high purity, and contains and keeps the substrates, etc. in this state.

The hermetically sealed container has its hermetically sealed state released when the substrates, etc. therein are taken out or the substrates are put thereinto. This releasing operation is performed under a highly clean environment, and this environment is one formed in the so-called atmosphere to the last. Accordingly, it is necessary to perform the so-called purging operation of exhausting the atmosphere (gas) introduced into the interior of the container after the container has been hermetically sealed and letting nitrogen or the like which is an inert gas flow thereinto. This purging operation is in some cases performed at a position whereat the putting of the substrates, etc. into and out of the container is effected, but when the substrates, etc. are large-sized, this operation is often performed in a system exclusively for purging with the purging efficiency taken into account.

The epitome of a conventional purging system is shown by way of example in Japanese Patent Application Laid-Open No. H7-86370 (see FIGS. 8 and 9 thereof and the item of the prior art). In this purging system, there are provided an inert gas introduction route and an exhaust route having openable and closable valves capable of communicating with the interior of a container. This container is installed in the purging system, and an intake valve in the introduction route and an exhaust valve in the exhaust route are opened to thereby effect the discharge of a gas present in the interiors of the container and the system and the introduction of an inert gas thereinto. Also, in a case where the substrates, etc. are preserved in the interior of this container for a long period, it is necessary to perform the operation of purging the interior of the container at suitable time intervals from the viewpoint of the quality control of the substrates, etc.

In this purging system, the inert gas to be supplied to the introduction route is maintained at predetermined pressure, and in the exhaust route, the exhaust amount thereof is made adjustable by the opening and closing of the exhaust valve. By effecting the adjustment of this exhaust amount, it is made possible to increase the pressure in the interior or the like of the container to a predetermined value, and after the increase in the pressure, the exhaust value is suitably increased to thereby achieve a reduction in the amount of consumed inert gas in the purging operation.

Also, in Japanese Patent No. 3191392, in a container left in a state containing substrates, etc., as a countermeasure for a case where an inert gas enclosed therein has leaked out of the container, there is disclosed a construction using a so-called pressure reducing valve as an intake valve in a gas introduction route. According to this construction, when the pressure in the interior of the container connecting to the secondary side of the pressure reducing valve assumes a predetermined value or less, an inert gas of predetermined pressure is introduced from the primary side of the pressure reducing valve to thereby keep the interior of the container at predetermined pressure.

As described above, in the purging operation for the portable type hermetically sealed container, the opening and closing of the intake valve for effecting the gas supply from a supply source of the inert gas of the predetermined pressure and the amount of opening and closing of the exhaust valve provided in the exhaust route are suitably adjusted to thereby effect the control of the pressure in the interior or the like of the container. Also, it is known to make the intake valve capable of adjusting pressure to thereby effect the control of the pressure in the interior or the like of the container.

Here, it is confirmed by the applicant that the pressure in the interior or the like of a container repeats the fluctuation of increase or decrease with this opening and closing operation. Accordingly, when the outflow of an inert gas or the like is controlled by the opening and closing of a valve, it seems to be difficult to accurately keep the pressure in the interior or the like of the container constant. Also, even in a case where as an exhaust valve, use is made of valve opening controllable one and it is controlled on the basis of the pressure in the interior or the like of the container, if the introduction of an inert gas is effected by the opening and closing of the valve, the pulsation of the inert gas is caused by this operation as has heretofore been experienced. This pulsation causes a fine pressure fluctuation at short time intervals in the interior of the container. This tendency is considered to become more remarkable as a gas supplying speed necessary for the container to become large becomes higher. Also, even if the intake valve is interchanged with a pressure reducing valve capable of adjusting pressure, pressure adjustment is basically effected by the opening and closing of an inert gas introduction valve, and it seems to be difficult to stabilize the pressure.

This fine pressure fluctuation occurring at short time intervals gives an unnecessary load to a seal member used to connect the interior of the container and the space in the purging system together as a hermetically sealed space, and may cause the deterioration of the seal member. Also, when the pressure fluctuation becomes extremely great, this seal member becomes incapable of completely keep a hermetically sealing state, and this may cause the leakage of the inert gas from the seal portion. Also, it is conceivable as a possibility that with the pressure fluctuation, vibration is given to substrates, etc. held in the interior of the container to thereby produce unexpected dust or the like.

SUMMARY OF THE INVENTION

The present invention has been made in view of the above-noted situation and has as its object to provide a purging system or a purging method which can reduce a pressure fluctuation in a space in the interior or the like of a container to thereby keep the inside pressure thereof substantially constant and prevent the deterioration of a seal member or the outflow of a gas from a seal portion resulting from the pressure fluctuation.

In order to solve the above-noted problems, the purging system according to the present invention is a purging system for purging the interior of a portable type hermetically sealed container, having a purging chamber communicating with the interior of the portable type hermetically sealed container to thereby form a hermetically sealed space when the portable type hermetically sealed container is opened, a gas supplying system communicating with the purging chamber and capable of supplying a predetermined gas to the hermetically sealed space while controlling the flow rate thereof, a gas exhaust system communicating with the purging chamber and capable of exhausting the gas present in the hermetically sealed space, and a pressure measuring apparatus communicating with the purging chamber for measuring pressure in the hermetically sealed space, wherein when the gas present in the hermetically sealed space is exhausted from the gas exhaust system, the flow rate of the predetermined gas supplied from the gas supplying system into the hermetically sealed space is changed in conformity with the pressure in the hermetically sealed space measured by the pressure measuring apparatus. It is preferable that the gas exhaust system in this purging system can control an exhaust flow rate when the gas present in the hermetically sealed space is exhausted.

Also, in order to solve the above-noted problems, the purging method according to the present invention is a purging method for a portable type hermetically sealed container, having the step of opening the portable type hermetically sealed container to thereby form a hermetically sealed space, the step of supplying a predetermined gas to the interior of the hermetically sealed space and exhausting the gas present in the interior of the hermetically sealed space to the exterior of the hermetically sealed space, and the step of closing the portable type hermetically sealed container, wherein at the step of supplying the predetermined gas to the interior of the hermetically sealed space, pressure in the interior of the hermetically sealed space is measured, and a flow rate when the predetermined gas is supplied is controlled on the basis of a result of the measurement of the pressure.

In the above-described purging method, it is preferable that a flow rate when the gas present in the interior of the hermetically sealed space is exhausted be also controlled. Also, in the above-described purging method, it is preferable that the step of supplying the predetermined gas to the interior of the hermetically sealed space and exhausting the gas present in the interior of the hermetically sealed space to the exterior of the hermetically sealed space have a first operation of supplying the predetermined gas to the interior of the hermetically sealed space at a first supply flow rate and exhausting the gas present in the interior of the hermetically sealed space at a first exhaust flow rate, and a second operation of supplying the predetermined gas to the interior of the hermetically sealed space at a second supply flow rate and exhausting the gas present in the interior of the hermetically sealed space at a second exhaust flow rate smaller than the first exhaust flow rate, which is an operation performed after the predetermined time has elapsed, wherein the first supply flow rate and the second supply flow rate are controlled on the basis of a result of the measurement of pressure.

In the present invention, the supply amount of a gas such as an inert gas introduced into the interior or the like of a portable type hermetically sealed container and the exhaust amount of the gas exhausted from the interior or the like of the container are adjusted in conformity with pressure in the interior or the like of the container. Thereby, a pressure fluctuation fine or at short time intervals in the interior of the portable type hermetically sealed container is reduced to a very slight one, and the execution of a purging operation in a state in which the pressure is kept at substantially constant pressure is made possible. Accordingly, the possibility that the deterioration of the seal member and the outflow or the like of the gas from the seal portion which have been found out by the applicant may occur becomes null.

Also, according to the present invention, the purging operation is divided into a flushing operation and a maintaining operation, and in the flushing operation, the exhaust of the gas in the interior of the container is achieved at a great flow rate, and after most of the gas in the interior of the container has been purged, as the maintaining operation, the exhaust of the gas in the interior of the container is achieved at a relatively small flow rate, thereby achieving the higher purity of the gas enclosed in the interior of the container after the purge. Therefore, as compared with an ordinary purging operation, there is obtained the effect of suppressing the flow rate of the gas required of the purging operation to a low level.

DESCRIPTION OF THE PREFERRED EMBODIMENTS

A purging system according to the present invention has as a requisite construction a purging chamber communicating with the interior of a portable type hermetically sealed container to thereby form a hermetically sealed space when the portable type hermetically sealed container is opened. This purging chamber has mounted therein a gas supplying system capable of supplying a predetermined gas to the hermetically sealed space while controlling the flow rate thereof when it communicates with the hermetically sealed space, a gas exhaust system capable of exhausting the gas present in the hermetically sealed space while controlling the flow rate thereof, and a pressure measuring apparatus communicating with the purging chamber for measuring pressure in the hermetically sealed space. The gas supplying system, the gas exhaust system and the pressure measuring apparatus are connected together through a control device, to thereby enable the flow rate of the predetermined gas supplied into the hermetically sealed space to be changed in conformity with the pressure in the hermetically sealed space when the gas in the hermetically sealed space is exhausted.

Also, the flow rate during the exhaust of the gas is made as great as possible at the start of purge, and the flushing of the gas in the interior of the container is effected efficiently and quickly, and after the purge of the inside gas has been done to a certain degree or more, it is preferable to suppress the exhaust flow rate, and execute further purge in a state in which the stabilization of the inside pressure is easy. Pressure fluctuation in the interior of the container is considered to greatly depend on the supply flow rate of the gas and therefore, even if in the construction of the present invention, the flow rate controlling function of the gas exhaust system is nullified, or is made into a simpler controlling function of two stages or the like instead of stageless adjustment, a similar effect is considered to be obtained. Also, the construction of a purging apparatus which will be described later includes a construction for an SMIF pod to the last, and does not restrict the above-described embodiment.

While in an embodiment hereinafter described, an SMIF pod is exemplarily shown as the portable type hermetically sealed container and an inert gas such as nitrogen of high purity is exemplarily shown as the predetermined gas, the mode of the present invention is not restricted to these exemplarily shown contents.

Figure 1:
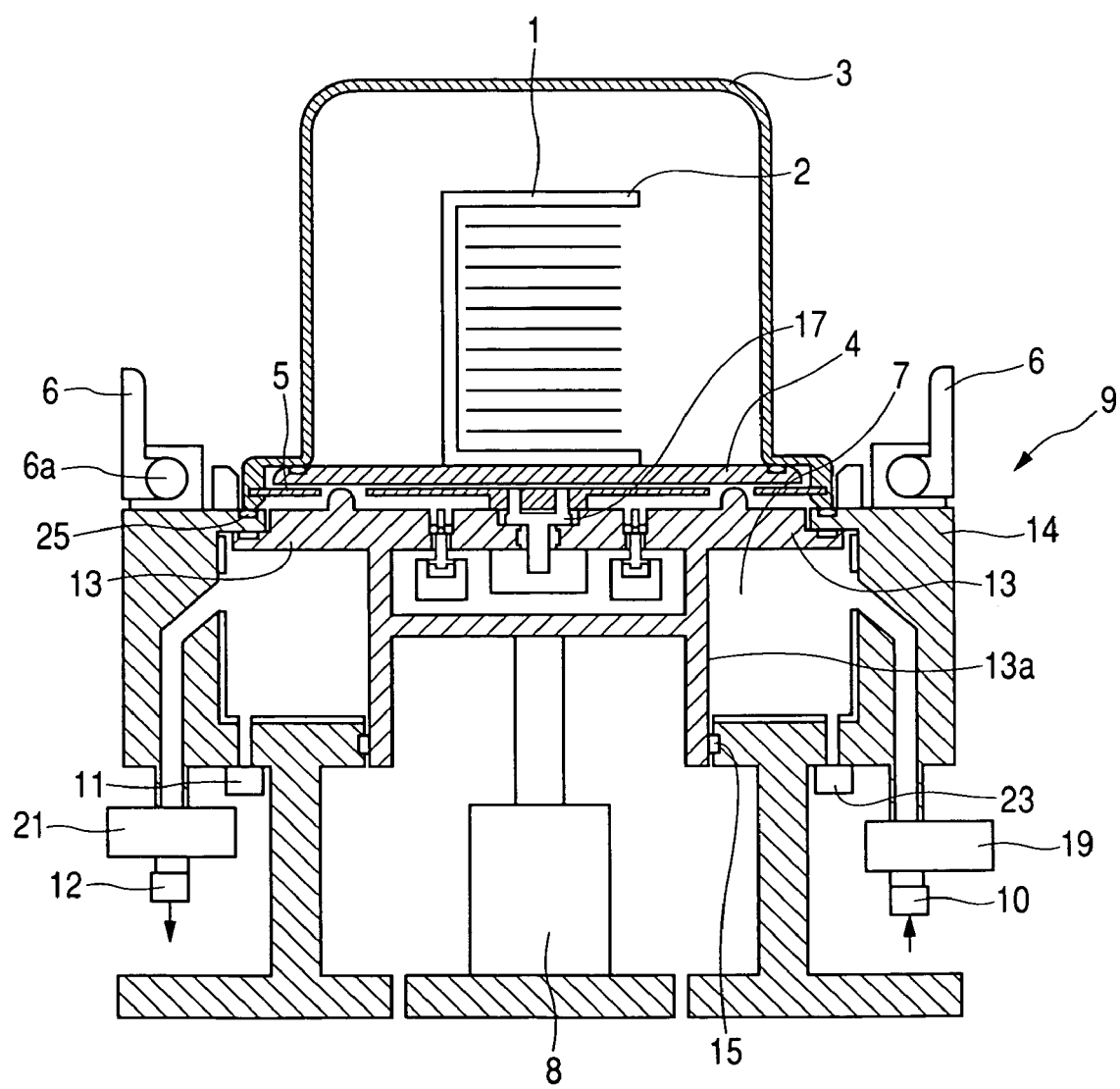
FIG. 1 shows a schematic cross-sectional view of a purging system (apparatus) according to an embodiment of the present invention and an SMIF pod which is the object of purge.

An embodiment of the present invention will hereinafter be described with reference to the drawings. In the present embodiment, description will be made of a case where as the portable type hermetically sealed container, a so-called SMIF pod comprising a pod having an opening portion vertically downwardly, and a pod door for closing this opening portion, and supporting a substrate or the like on the upper surface of this pod door is an object. FIG. 1 schematically shows the SMIF pod and a cross-section of a purging apparatus (system) on which the pod is placed and which performs a purging operation for the interior thereof. As is known, the SMIF pod has an opening portion below it, and the opening portion is closed by the pod door 4.

Also, a plurality of silicon wafers 1 contained in a wafer cassette 2 are placed on the upper surface of the pod door 4. A pod latch mechanism 5 is disposed on the underside of the pod door 4. The pod latch mechanism 5 comprises a bar-shaped member and a pivotally movable member provided on the center of the bar-shaped member, and design is made such that the pivotally movable member is pivotally moved by an operation from the outside, whereby the bar-shaped member is expanded or contracted in the lengthwise direction thereof. For example, the bar-shaped member is expanded by the latching operation of the pod latch mechanism 5, whereby the fixing of the pod door 4 to the SMIF pod 3 is done.

A gas purging apparatus 9 has as the main constructions thereof a main body portion 14 having an upper surface capable of supporting the lower end of the SMIF pod 3, a port door 13 supporting the pod door 4 on the upper surface thereof, and a cylinder mechanism 8 making the port door 13 movable in a vertical direction. A hold-down latch 6 is disposed around the receiving surface of the SMIF pod 3 in the main body portion 14. This hold-down latch 6 is a hook-shaped member pivotally movable about a pin 6a, and this latch 6 is pivotally moved and is brought into engagement with the flange portion 3a of the SMIF pod 3, whereby the fixing of the SMIF pod 3 to the gas purging apparatus 9 is effected.

Also, on the upper surface of the port door 13, there is disposed a pivotally moving mechanism 17 for expanding or contracting the aforedescribed pod latch mechanism 5. When the opening portion of the SMIF pod 3 is to be opened, the pod door 4 is fixed to the port door 13 through the pod latch mechanism 5, etc. In this state, the port door 13 is downwardly driven, whereby the aforedescribed opening operation is performed.

The main body portion 14 has a space portion conforming to the size of the port door 13 so as to make the port door 13 movable in a vertical direction. The port door 13 has, below it, an area 13a of which the size when seen from above it becomes smaller than the size of the port door 13. Below the aforementioned space portion, there is an opening 14a through which only this area 13a can pass, and an O-ring 15 is disposed on a surface opposed to the area 13a in this opening 14a. This space becomes a space closed by the O-ring 15, and is used as a purging chamber 7 when the purge of the SMIF pod is effected.

The purging chamber 7 has connected thereto an inert gas supplying system, a gas exhaust system, a pressure measuring apparatus 23 and an atmospheric pressure liberating valve 11. In the inert gas supplying system, there are disposed a gas supply flow rate regulating apparatus 19 and a gas supplying valve 10 in the order nearer to the space, and the gas supplying valve 10 is connected to a gas source, not shown, for supplying an inert gas of predetermined pressure. In the gas exhaust system, there are disposed a gas exhaust flow rate regulating apparatus 21 and a gas exhaust valve 12 in the order nearer to the space, and the gas is exhausted to the outside of the purging apparatus 9 through this exhaust valve 12. In order to heighten the exhaust flow rate of the gas, an exhaust pump may be disposed at the rear stage of this valve 12.

During an actual purging operation, the pod door 4 is moved to substantially the lower end position of the purging chamber 7 by the port door 13, and the space in the interior of the pod 3 communicates with the purging chamber 7. At the same time, by the action of the hold-down latch 6, the lower end portion of the pod 3 is brought into close contact with an O-ring 25 disposed on the pod receiving surface of the main body portion 14 of the purging apparatus, and the space between it and the outside of the pod is completely sealed. Accordingly, the purging operation is performed for a hermetically sealed space formed with the space in the interior of the pod 3 and the purging chamber 7 communicating with each other.

Figure 2:
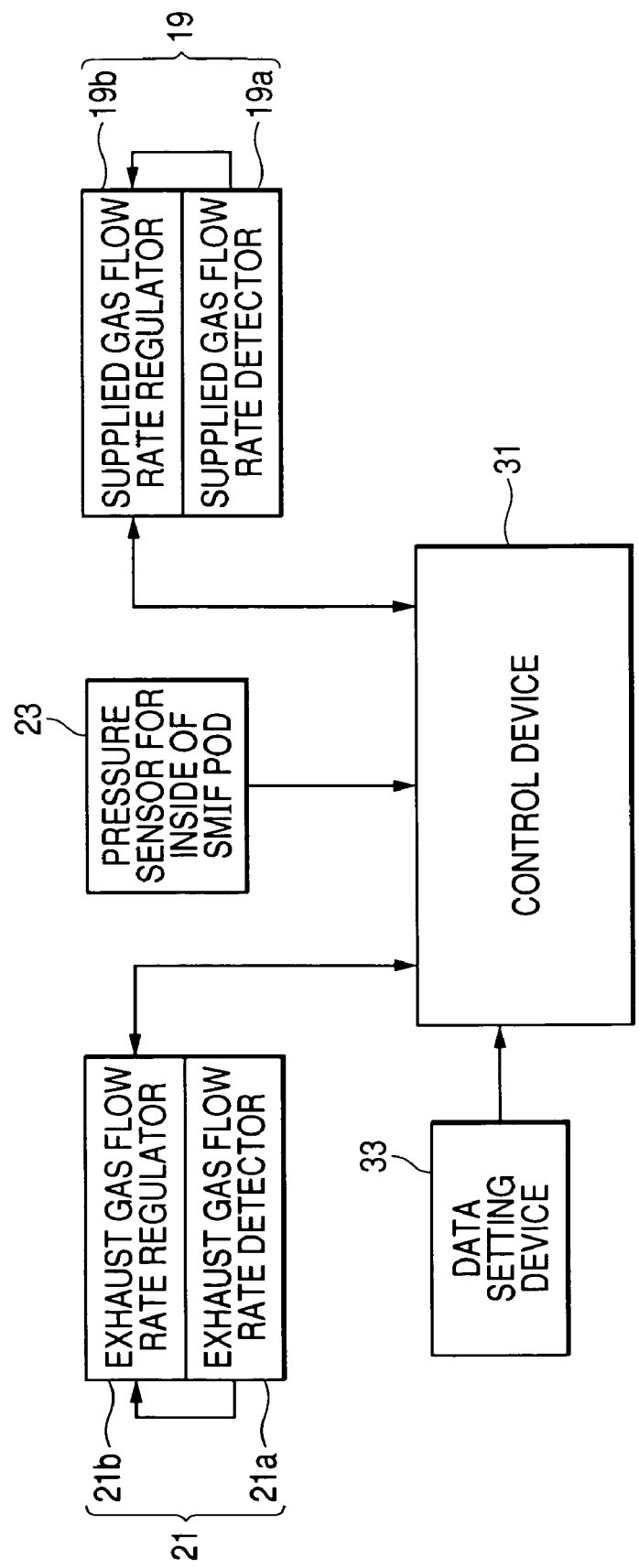
FIG. 2 is a block diagram showing the relations among the main constructions of the purging system according to the embodiment of the present invention.

FIG. 2 shows main constructions regarding the control system of the purging apparatus as a block diagram. FIG. 2 shows the constructions according to the present invention added to a control device for controlling the ordinary operation of the hold-down latch 6, the operation of the latch mechanism 5 and the operation of the cylinder mechanism 8. The aforedescribed gas supply flow rate regulating apparatus 19 comprises a supplied gas flow rate detector 19a and a supplied gas flow rate regulator 19b, and is connected to a control device 31. The aforedescribed gas exhaust flow rate regulating apparatus 21 also comprises an exhaust gas flow rate detector 21a and an exhaust gas flow rate regulator 21b, and is connected to the control device 31.

A data setting device 33 is used to send conditions such as the pressure in the interior of the pod to be obtained, and the flow rate of the inert gas supplied to the control device 31 at that time. Data regarding a pressure fluctuation, etc. sent from a pressure sensor 23 for the inside of SMIF pod to the control device 31 is judged in the control device 31, and is fed back to the control parameters of the regulating apparatuses 19 and 21.

Figure 3:
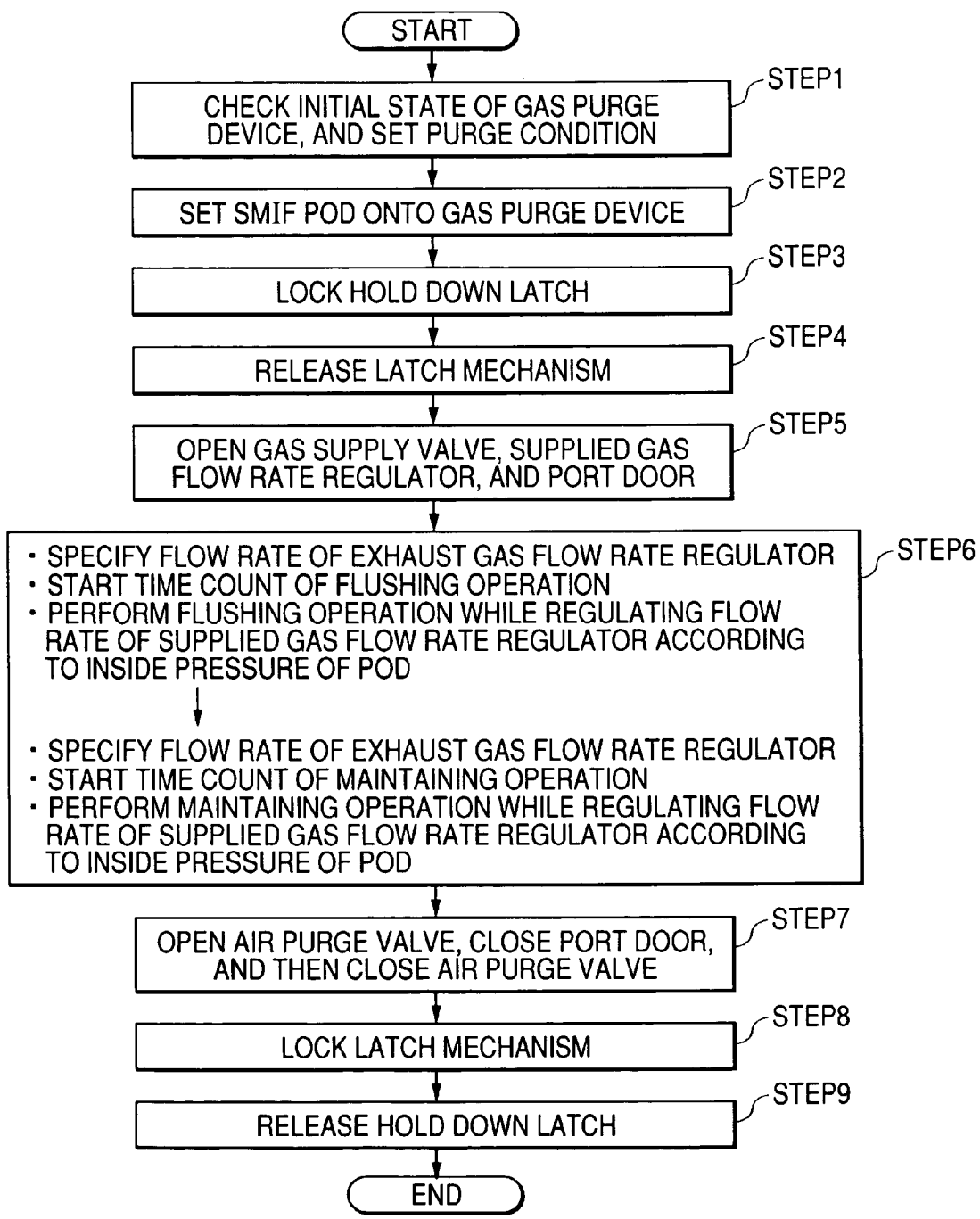
FIG. 3 is a flow chart showing a purging method according to an embodiment of the present invention.
Figure 4:
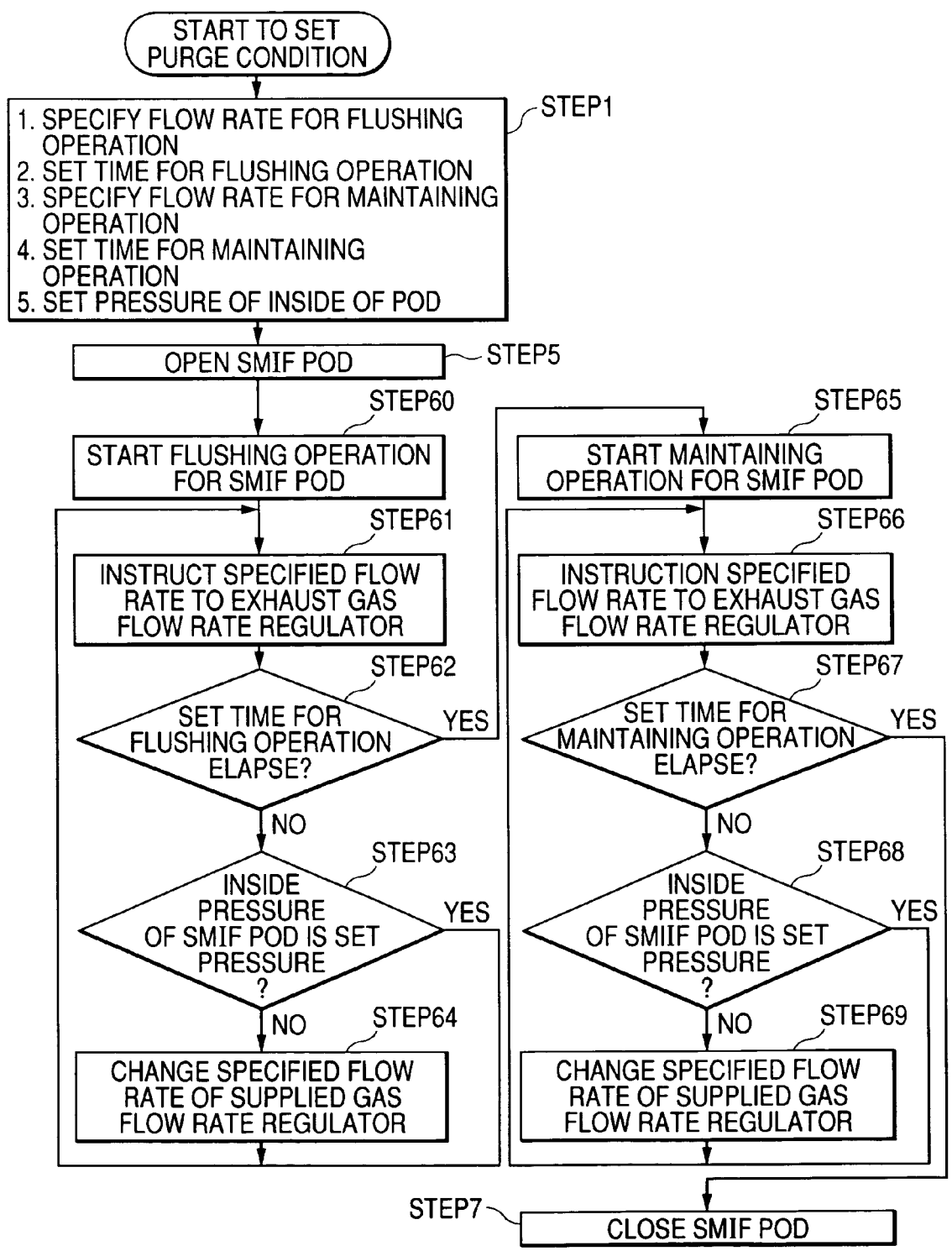
FIG. 4 illustrates the details of the main portions of the flow chart shown in FIG. 3.

The purging operation actually performed by the use of this gas purging apparatus will now be described with reference to flow charts shown in FIGS. 3 and 4. First, at a step 1, the confirmation of the initial state of the gas purging apparatus 9 and the operation of setting purging conditions for the SMIF pod such as the supply and exhaust flow rates of the inert gas required for the flushing operation, the time for which the flushing operation is performed, the supply and exhaust flow rates when the maintaining operation is performed, the time for which the maintaining operation is performed, and the inside pressure of the pod are performed by the use of the data setting device 33, etc. The flushing operation and the maintaining operation are operations peculiar to the present invention, and the flushing operation shows the operation of exhausting the gas enclosed at first, and the maintaining operation shows an operation for decreasing the gas flow rate after the initial purge of the gas has been effected to a predetermined level by the flushing operation, and suppressing the amount of consumption of the inert gas to thereby obtain a desired purged state. After the termination of the setting, the SMIF pod is placed at a predetermined position on the gas purging apparatus 9.

After the SMIF pod has been placed, the hold-down latch 6 is operated and the SMIF pod 3 is fixed to the gas purging apparatus 9 to thereby achieve the prevention of the outflow of the gas from the joint portion between the SMIF pod 3 and the gas purging apparatus 9 (step 3). Subsequently, the latch mechanism 5 is released to thereby enable the pod door 4 to be spaced apart from the SMIF pod 3 (step 4). Thereafter, at a step 5, the operation of actually opening the SMIF pod is performed. At that time, the gas supplying valve 12 is opened in advance, and the supplied gas flow rate regulator 19b is also opened. After the pod has been opened, the control of the supplied gas flow rate and the exhaust gas flow rate based on the pressure in the pod is effected, and the purging operation is performed while the pressure in the pod is kept constant (step 6).

The purging operation performed at the step 6 will hereinafter be described in detail with reference to FIG. 4. At a step 60, instructions to start the flushing operation in the purging operation are given. At this stage, the supply of the inert gas becomes possible, but the gas exhaust valve is closed and therefore, the actual flushing of the gas in the interior of the container has not yet been done. In response to the instructions to start the flushing operation, at a step 61, the gas exhaust flow rate regulating apparatus 21 is instructed to make the exhaust gas flow rate assume the value set at the step 1. Thereby, the gas exhaust valve 12 is opened and the gas in the pod is exhausted at the set flow rate, and the flushing operation for this gas is started.

Thereafter, at a step 62, whether the flushing operation has been performed for the set time is discriminated, and after the lapse of this time, shift is made to the execution of the maintaining operation at a step 65. If this time has not elapsed, advance is made to a step 63, where the pressure in the pod is measured by the pressure measuring device 23. If the obtained pressure differs from the set pressure, the gas supply flow rate regulating apparatus 19 is controlled so that the pressure in the pod may assume a predetermined value (step 64). Thereafter, return is made to the step 61, whereafter these operations are repeated, and with the supply flow rate of the inert gas controlled, it is waited for that the flushing operation is performed for the set time.

After the set time has elapsed, instructions to start the maintaining operation at a step 65 are given. On the basis of these instructions, at a step 66, the gas flow rate value during the maintaining operation set at the step 1 is transmitted to the gas exhaust flow rate regulating apparatus 21 to thereby change the gas exhaust flow rate. Thereafter, at a step 67, whether the flushing operation has been performed for the set time is discriminated, and if this time has not elapsed, advance is made to a step 68, where the pressure in the pod is measured by the pressure measuring device 23. If the obtained pressure differs from the set pressure, the gas supply flow rate regulating apparatus 19 is controlled so that the pressure in the pod may assume a predetermined value (step 69). Thereafter, return is made to the step 66, whereafter these operations are repeated, and with the supply flow rate of the inert gas controlled, it is waited for that the maintaining operation is performed for the set time.

After the termination of the maintaining operation, the SMIF pod closing operation of a step 7 and so on is performed. At the step 7, the port door 13 is moved up, and the opening portion of the SMIF pod 3 is closed by the pod door 4. At that time, the atmospheric pressure liberating valve 11 is opened to let the gas exhausted from the interior of the pod escape from the purging chamber 7. After the opening portion has been closed, this atmospheric pressure liberating valve 11 is quickly closed. Further, at a step 8, the latch mechanism 5 is operated to thereby fix the pod door 4 to the SMIF pod 3, and at a step 9, the hold-down latch 6 is rendered into an inoperative state, thereby making the SMIF pod detachable from the gas purging apparatus 9.

As described above, the purging operation is divided into the flushing operation and the maintaining operation, and gas exhaust flow rates conforming to the individual operations are provided, whereby it becomes possible to perform a quick purging operation. Also, the pressure in the pod, etc. during the individual operations is measured and the supply flow rate of the inert gas is controlled in conformity with the fluctuation of the pressure, whereby it becomes possible to perform the purging operation without causing any fine pressure fluctuation.

The above-described conditions set at the step 1 differ depending on the shape of the pod, the density of an organic gas to be purged, etc. Accordingly, in the setting of these conditions, it is preferable that an experiment or the like be actually carried out and the setting be done on the basis of the result thereof. Also, each of the above-described parameters is an example, and it is preferable that they be suitably changed in conformity with the actual form of the application of the invention.

The foregoing embodiment has been described with respect to the purging apparatus and the purging method for the SMIF pod with this pod as an example of the portable type hermetically sealed container. The present invention, however, is applicable to portable type hermetically sealed containers such as an FOUP type pod and a container for containing a glass substrate therein, or all of containers having action equal thereto. Also, the present invention is applicable as a purging system in a so-called load port for taking out a substrate contained in a portable type hermetically sealed container, as opposed to, for example, an apparatus for effecting various kinds of processing on a substrate.

This application claims priority from Japanese Patent Application No. 2003-332936 filed Sep. 25, 2003, which is hereby incorporated by reference herein.

What is claimed is:

1. A purging method for a portable type hermetically sealed container in use of a purging system, comprising:

opening said portable type hermetically sealed container connected to said purging system through a sealing member, to communicate an interior of said portable type hermetically sealed container with an interior of the purging system to thereby form a hermetically sealed space;

flushing, during a predetermined time from a start of purge, by supplying a predetermined gas to the interior of said hermetically sealed space at a first supply flow rate and exhausting the gas present in the interior of said hermetically sealed space to the exterior of said hermetically sealed space at a first exhaust flow rate;

maintaining, after said predetermined time has elapsed, the supplying of the predetermined gas to the interior of said hermetically sealed space at a second supply flow rate and exhausting the gas present in the interior of said hermetically sealed space to the exterior of said hermetically sealed space at a second exhaust flow rate smaller than said first exhaust flow rate; and closing said portable type hermetically sealed container wherein at said flushing, said first supply flow rate and said first exhaust flow rate is controlled so as to keep a pressure in said hermitically sealed space at a predetermined value, wherein during said maintaining of supplying, said second supply flow rate and said second exhaust flow rate are controlled so as to keep a pressure in said hermitically sealed space at a predetermined value, and controlling said predetermined value of pressure at said flushing step and said predetermined value of pressure at said maintaining step at a constant value.

2. A purging method according to claim 1, wherein said first supply flow rate is greater than said second supply flow rate.

3. A purging method for a portable type hermetically sealed container, comprising:

opening said portable type hermetically sealed container to thereby form a hermetically sealed space;

supplying a predetermined gas to the interior of said hermetically sealed space and exhausting the gas present in the interior of said hermetically sealed space to the exterior of said hermetically sealed space; and closing said portable type hermetically sealed container;

wherein at the supplying of the predetermined gas to the interior of said hermetically sealed space, pressure in the interior of said hermetically sealed space is measured, and a flow rate when the predetermined gas is supplied is controlled on the basis of a result of the measurement of said pressures, wherein the supplying of the predetermined gas to the interior of said hermetically sealed space to the exterior of said hermetically sealed space and exhausting the gas present in the interior of said hermetically sealed space to the exterior of said hermetically sealed space includes:

a first operation of supplying the predetermined gas to the interior of said hermetically sealed space at a first supply flow rate and exhausting the gas present in the interior of said hermetically sealed space at a first exhaust flow rate, which is an operation performed for a predetermined time, and a second operation of supplying the predetermined gas to the interior of said hermetically sealed space at a second supply flow rate and exhausting the gas present in the interior of said hermetically sealed space at a second exhaust flow rate smaller than said first exhaust flow rate, which is an operation performed after said predetermined time has elapsed, wherein said first supply flow rate and said second supply flow rate are controlled on the basis of a result of the measurement of said pressure.

4. A purging method according to claim 3, wherein said first supply flow rate is greater than said second supply flow rate.

* * * * *